United States Patent
Parker et al.

(10) Patent No.: US 6,836,432 B1
(45) Date of Patent: Dec. 28, 2004

(54) PARTIAL PAGE PROGRAMMING OF MULTI LEVEL FLASH

(75) Inventors: Allan Parker, Austin, TX (US); Glen Lam, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 51 days.

(21) Appl. No.: 10/074,495

(22) Filed: Feb. 11, 2002

(51) Int. Cl.$^7$ .............................................. G11C 16/04
(52) U.S. Cl. ..................... 365/185.03; 365/185.12; 365/185.22; 365/185.24; 365/185.25
(58) Field of Search ..................... 365/185.03, 185.12, 365/185.22, 185.24, 185.25

(56) References Cited

U.S. PATENT DOCUMENTS

| | | | | |
|---|---|---|---|---|
| 5,724,284 A | * | 3/1998 | Bill et al. ................. | 365/185.2 |
| 5,815,434 A | * | 9/1998 | Hasbun et al. .......... | 365/185.03 |
| 5,903,497 A | | 5/1999 | Yu et al. ................. | 365/185.22 |
| 5,936,884 A | * | 8/1999 | Hasbun et al. .......... | 365/185.03 |
| 6,064,597 A | | 5/2000 | Takeshima et al. ..... | 365/185.24 |
| 6,067,248 A | * | 5/2000 | Yoo ........................ | 365/185.03 |
| 6,288,936 B1 | * | 9/2001 | Kawamura .............. | 365/185.03 |
| 6,563,745 B1 | * | 5/2003 | Ilkbahar ................. | 365/189.07 |
| 2003/0016562 A1 | * | 1/2003 | Im .......................... | 365/189.02 |

* cited by examiner

Primary Examiner—Connie C. Yoha (57) ABSTRACT

A recording medium includes a computer readable program for controlling a computer. The program comprises (a) code for calculating a current distribution by using a strength and phase of magnetic field measured from a measuring object; (b) code for calculating a first electric field strength at a measuring point from the current distribution; (c) code for calculating a second electric field strength at the measuring point by using a current distribution of a predetermined position on a part of the current distribution of the measuring object; and (d) code for calculating a ratio related to the first electric field strength in association with the second electric field strength.

19 Claims, 8 Drawing Sheets

| LEVEL | Q2 | Q1 |
|---|---|---|
| 2 | 0 | 0 |
| 1 | 0 | 1 |
| 0 | 1 | 0 |
| Erase | 1 | 1 |

PARTIAL PAGE PROGRAMMING OF MULTI LEVEL FLASH

TECHNICAL FIELD

Embodiments of the present invention relate to flash electrically erasable programmable read only memory semiconductor devices. More particularly, embodiments of the present invention provide a method and apparatus for partial page programming of a multi level flash device.

BACKGROUND ART

Flash memory is a type of semi conductor computer memory with many desirable characteristics. Like read only memory, ROM, it is non-volatile, meaning that the contents of the memory are stable and retained without applied electrical power.

A major advantage of flash over ROM is that the memory contents of flash may be changed after the device is manufactured. However, flash memory generally can not be written to, or programmed, at rates comparable to random access memory, RAM. Further, flash generally must be erased, either in its entirety or in large segments called pages, prior to changing its contents.

Flash memory has found wide acceptance in many types of computers, including desktop computers, mobile phones and hand held computers. Flash memory is also widely used in digital cameras and portable digital music players, for example "MP3" players.

In addition to direct flash storage applications, for example in video cameras, flash-based storage devices are replacing rotating magnetic disks, sometimes known as hard drives, in many applications. Compared to hard drives, flash is significantly more rugged, quieter, lower power, and for some densities such a flash based device may be smaller than a comparable hard drive.

As discussed above, a page of flash memory generally must be erased before new data may be stored in that page. Erasing a page is generally a long process, typically measured in hundreds of milliseconds. This is a disadvantage compared to RAM and hard drives, which may be written directly, without an interposing erasure.

In order to mitigate this drawback, some flash devices are capable of partial page programming. Partial page programming is a technique whereby some of the contents of a page of flash memory may be updated without erasing. Typically, a cell of flash memory is described as being either in the erased state or the programmed state. Either state, programmed or erased, may be assigned the binary value 0, and the other state may be assigned the binary value 1.

Assuming the erased state is assigned the binary value 1, partial page programming generally allows instances of 1 in the programmed page to be changed to a value of 0, without an intervening erase process. In general, cells programmed to a value of 0 may not be changed to a 1 value. Changing a cell from a 0 to a 1 typically requires the page or block erase process.

The applications described above, and others, have driven very large demand for flash devices, both in total numbers of devices and in total bits. An innovative technique recently developed by several flash manufacturers is to store multiple bits in each cell of the flash device. For example, if the circuitry of a flash device could discern three storage levels for each cell, every two cells could store three bits of information, resulting in 50% more storage for the same memory cell area. If the cells could store four levels, the result would be to double the density of the device. This technique and capability is generally referred to as a multi level cell, or MLC.

Due to the high order density increases afforded by MLC, such designs are extremely attractive to both manufacturers and customers. Manufacturers benefit by being able to produce many more bits of flash memory without increased capital spending, and customers enjoy reduced physical product size and significant cost per bit advantages.

Unfortunately, partial page programming has not been available in conventional MLC devices, rendering MLC flash less attractive in many applications.

Therefore, what is needed is a method and apparatus for partial page programming of a multi level cell flash device. Partial page programming will bring many benefits to multi level cell flash devices.

DISCLOSURE OF THE INVENTION

Therefore, it would be advantageous to provide a method and system providing for partial page programming of multi level cell flash memory. A further need exists for a method of combining new information and previously stored information in a multi level flash memory device.

A method and apparatus for partial page programming of a multi level cell flash memory is disclosed. In a multi level cell flash memory, new partial page programming information may be accessed. Information previously stored in the memory may be accessed. New and previous information may be combined in a page buffer of a flash device. Optionally, new and previous information may be combined in a memory external to the flash device. The combined information may be used to program the cells of a flash memory. A standard programming and verification method may be used to program the combined information into the cells of a flash memory. In this novel manner the benefits of partial page programming may be realized for multi level cell flash memory devices.

BEST MODE FOR CARRYING OUT THE INVENTION

In the following detailed description of the present invention, partial page programming of a multi level flash, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Partial Page Programming of Multi Level Flash

Embodiments of the present invention are described in the context of semiconductor flash memory. However, it is appreciated that the present invention may be utilized in other types of memory devices where it may be desirable update contents from an intermediate state.

Figure 1:
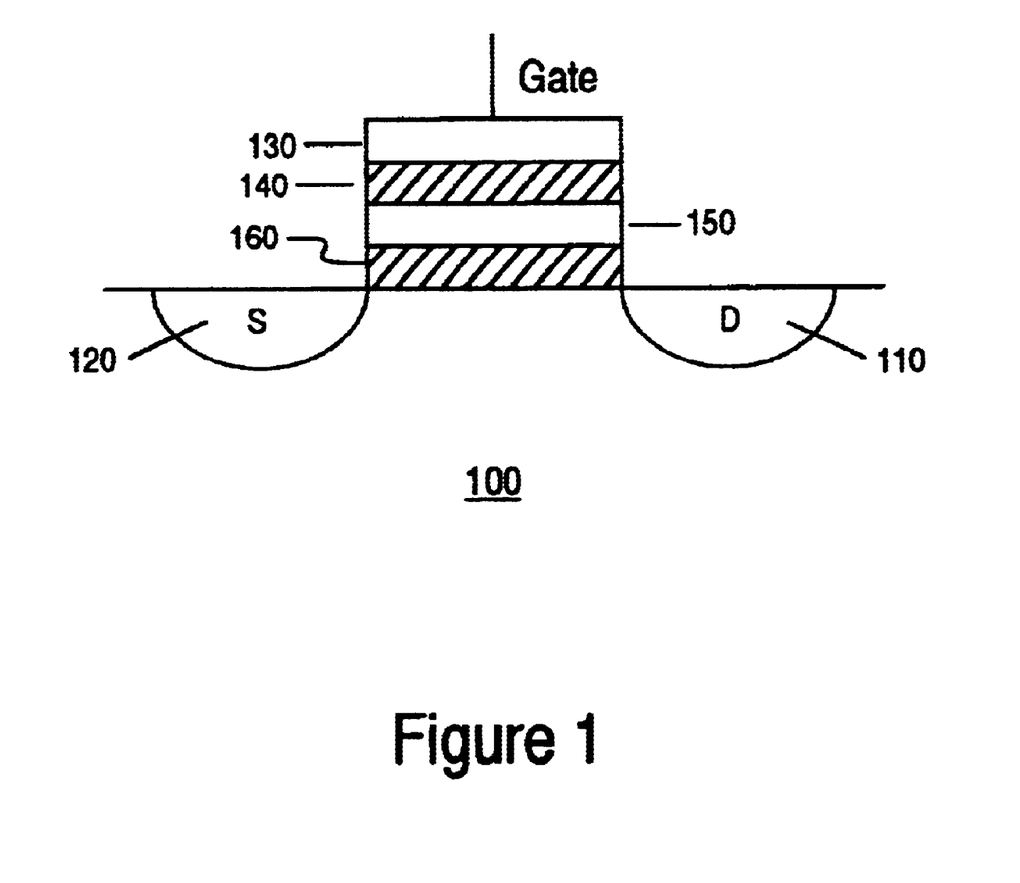
FIG. 1 is an illustration of a multi level cell flash cell, according to an embodiment of the present invention.

FIG. 1 is an illustration of a multi level cell flash cell 100, according to an embodiment of the present invention. A multi level cell flash memory device may consist of very many such cells along with address circuitry, in addition to read, erase and program circuitry.

Multi level cell flash cell 100 may consist of a gate 130, a source 120 and a drain 110. Insulators 140 and 160 may be composed of an oxide material. Floating gate 150 may store charge.

A threshold voltage of the floating gate 150 may be adjusted by injection or removal of electrons from the floating gate 150. If the gate voltage is greater than the threshold voltage, the cell may conduct greater than 1 micro ampere, and is said to be in the erased state. If the gate voltage is less than the threshold voltage, the cell may conduct less than 1 micro ampere, and is said to be in the programmed state.

A characteristic of the construction of cell 100 is that four relatively narrow ranges of threshold voltage may be stored, and, more importantly, determined at a later time. This ability leads to the capability of storing multiple bit values in a single cell. Since cell 100 may store four ranges, these ranges may represent two bits, or four states.

Figure 2:
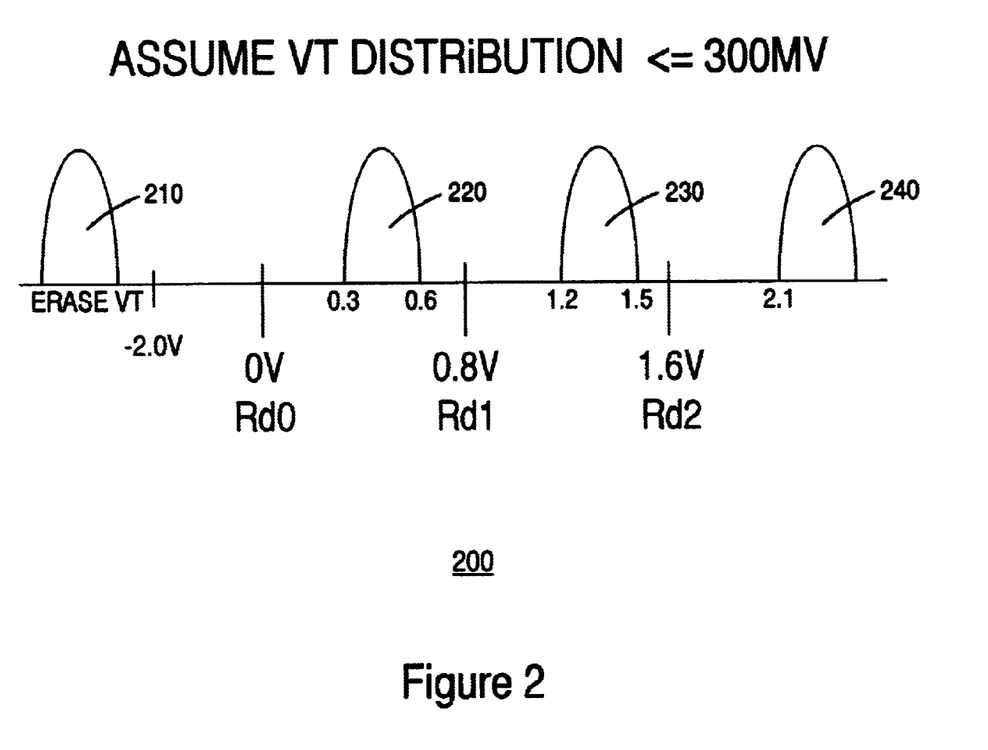
FIG. 2 is a graph of stable threshold voltage distributions for a multi level cell flash cell, according to an embodiment of the present invention.

FIG. 2 is a graph 200 of stable threshold voltage distributions for a multi level cell flash cell, according to an embodiment of the present invention. The vertical axis is number of charge carriers, and the horizontal axis is voltage of the charge carrier.

Distribution 240 may represent a charge distribution with a voltage threshold of greater than 1.6 volts. Distribution 230 may represent a charge distribution with a voltage threshold of greater than 0.8 volts but less than 1.6 volts. Distribution 220 may represent a charge distribution with a voltage threshold of greater than 0.0 volts but less than 0.8 volts. Distribution 210 may represent a charge distribution with a voltage threshold of less than zero volts.

During read operations on multi level cell flash cell 100, detecting a threshold voltage on floating gate 150 of greater than 1.6 volts may be interpreted as a binary value of "00." A voltage threshold of between 0.8 volts and 1.6 volts may be interpreted as "01." A voltage threshold of between 0 volts and 0.8 volts may be interpreted as ""10." A voltage of less than zero volts may be interpreted as "erased" and assigned the binary value of "11." It is appreciated that the assignment of a particular binary value to a particular charge distribution state is arbitrary, and that other possible associations are well suited to embodiments of the present invention.

Figure 3:
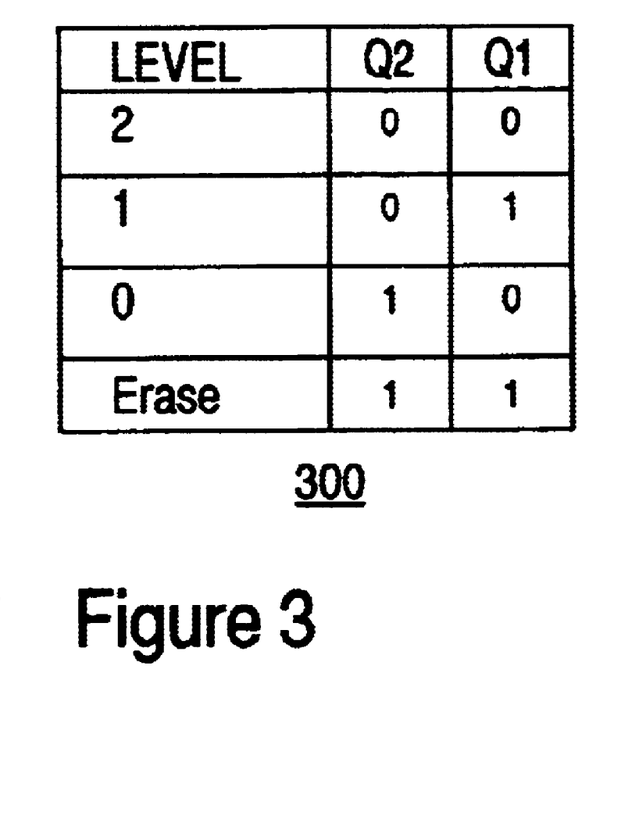
FIG. 3 shows a table depicting a mapping of levels to a two-bit binary value.

FIG. 3 shows a table 300 depicting a mapping of levels to a two-bit binary value. Q2 and Q1 represent bit values, according to an embodiment of the present invention. For example, the erase state is assigned the binary value "11." It is appreciated that the assignment of a particular binary value to a particular level is arbitrary and that Q1 and Q2 may be exchanged, and that other possible associations are well suited to embodiments of the present invention.

Figure 4A:
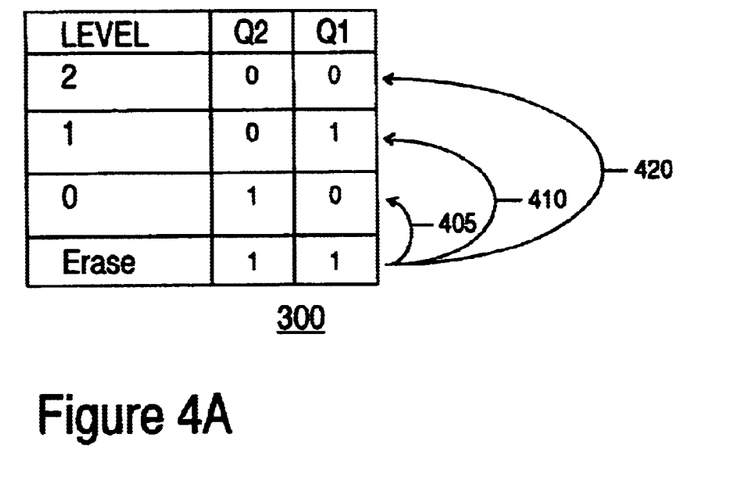
FIGS. 4A, 4B and 4C show allowable partial page program transitions, according to embodiments of the present invention.

FIG. 4A shows allowable program transitions from the erase state, according to an embodiment of the present invention. Transition 405 represents storing a binary "10," into cell 100. Referring to FIG. 2, it may be seen that transition 405 may represent a change in the charge distribution of floating gate 150 from region 210 to region 220, or an increase in voltage threshold. Similarly, transition 410 represents storing a binary "01" into cell 100. Referring one again to FIG. 2, it may be seen that transition 410 may represent a change in the charge distribution of floating gate 150 from region 210 to region 230, or an increase in voltage threshold. Finally, transition 420 represents storing a binary "00" into cell 100. Again referring to FIG. 2, it may be seen that transition 420 may represent a change in the charge distribution of floating gate 150 from region 210 to region 240, or an increase in voltage threshold. Importantly, the three described transitions, 405, 410 and 420, all increase a voltage threshold.

A characteristic of a multi level cell flash device is that a user is generally unaware of such encodings. Data is generally presented to such a flash device in a parallel fashion of a convenient data width, typically 8 or 16 bits wide. Importantly, a user can not typically specify which bit might be assigned "Q1 " or "Q2." Hence, for partial page programming of a multi level cell flash device, a restriction is placed on the user that is similar to the restriction placed on the user of a conventional partial page programmable flash device, that is, a flash device that stores a single bit per cell.

That restriction may be generally stated as: "a data bit may be changed in only one direction." For the purposes of the examples herein, that direction has been chosen to allow a bit transition from "1" to "0." It is appreciated that other well known transitions are well suited to embodiments of the present invention.

Figure 4B:
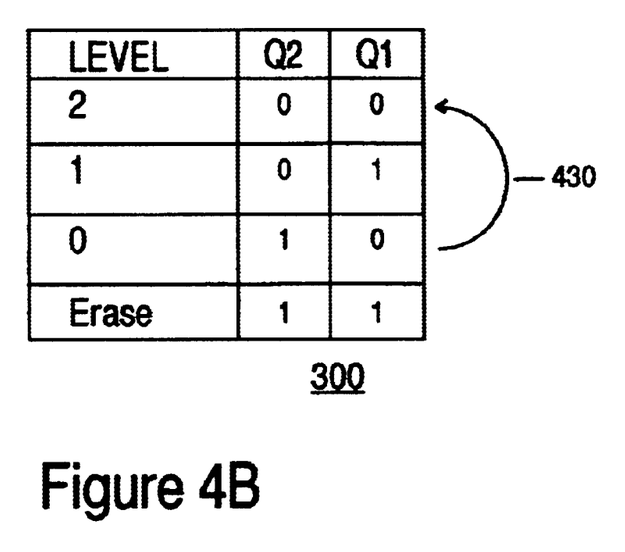

FIG. 4B shows the allowable transition from the level zero state, according to an embodiment of the present invention. Transition 430 represents changing the cell 100 value from "10" to "00." Referring to FIG. 2, it may be seen that transition 430 may represent a change in the charge distribution of floating gate 150 from region 220 to region 240, or an increase in voltage threshold. Importantly, this transition conforms to the rule that a bit is changed in only one direction. Importantly, transition 430 increases a voltage threshold.

Figure 4C:
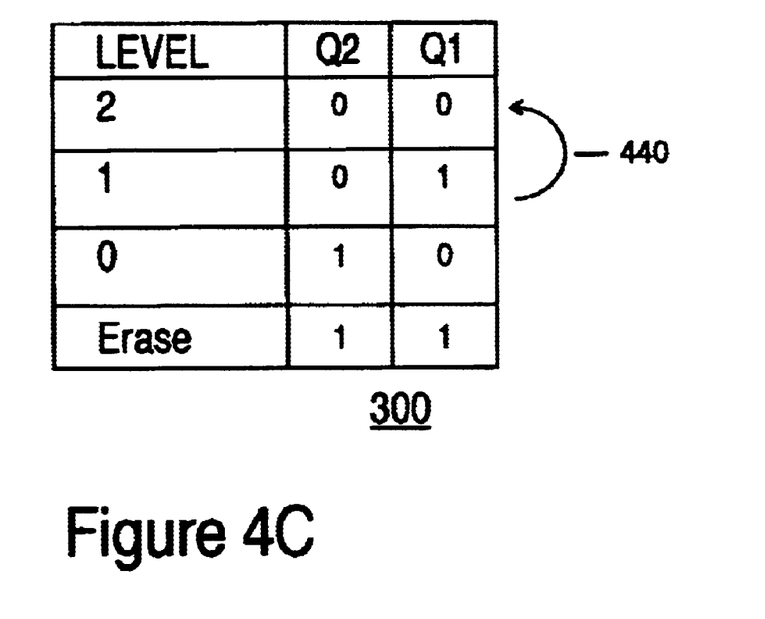

FIG. 4C shows the allowable transition from the level one state, according to an embodiment of the present invention. Transition 440 represents changing the cell 100 value from "01" to "00." Referring once more to FIG. 2, it may be seen that transition 440 may represent a change in the charge distribution of floating gate 150 from region 230 to region 240, or an increase in voltage threshold importantly, this transition conforms to the rule that a bit is changed in only one direction. Importantly, transition 440 increases a voltage threshold.

Another transition (not shown) is possible at the cell level, corresponding to changing the cell 100 value from "10" to "01." Such a transition would correspond to changing the charge distribution from region 220 to region 230. Such a transition does correspond to an increase in voltage threshold. However, it may be seen that such a transition would violate the "one bit, one direction" rule, as both bits are changed, and one changes in the disallowed direction. Hence, to shield users from the complexity of managing which bit patterns are mapped to which levels, this transition is not allowed at the device level.

Importantly, disallowing this transition maintains backward compatibility with single bit per cell partial page programmable flash devices. Further, and also of great importance, disallowing this transition enables forward compatibility to flash devices that may store more than two bits per cell. Any given multi bit transition may not be available in future multi level cell devices with a higher number of bits per cell, or even with a different encoding. For example, if the encoding was reversed such that "00" represented the highest threshold voltage, then the "10" to "01" transition would likely not be possible.

Referring once again to FIG. 2, it may be seen that a programming process for cell 100 may be seen as adding charge to floating gate 150. Conventional programming adds enough charge to the erase state to produce the desired threshold voltage. In other words, referring to FIG. 4A, each transition 405, 410 or 420 may represent adding a fixed amount of charge to cell 100. However, it may be seen that transition 440 (FIG. 4C) is very different from transition 420 (FIG. 4A), even though both transitions produce the same charge state, level 2.

Referring back to FIG. 2, it may be seen that transition 420 must add enough charge to floating gate 150 to move a threshold voltage from region 210 to region 240. However, to complete transition 440, substantially less charge must be added, only that amount of charge necessary to move from region 230 to region 240. Consequently, even though the desired end state may be the same, partial page programming of a multi level cell flash cell must differentiate between the two programming processes.

Figure 5:
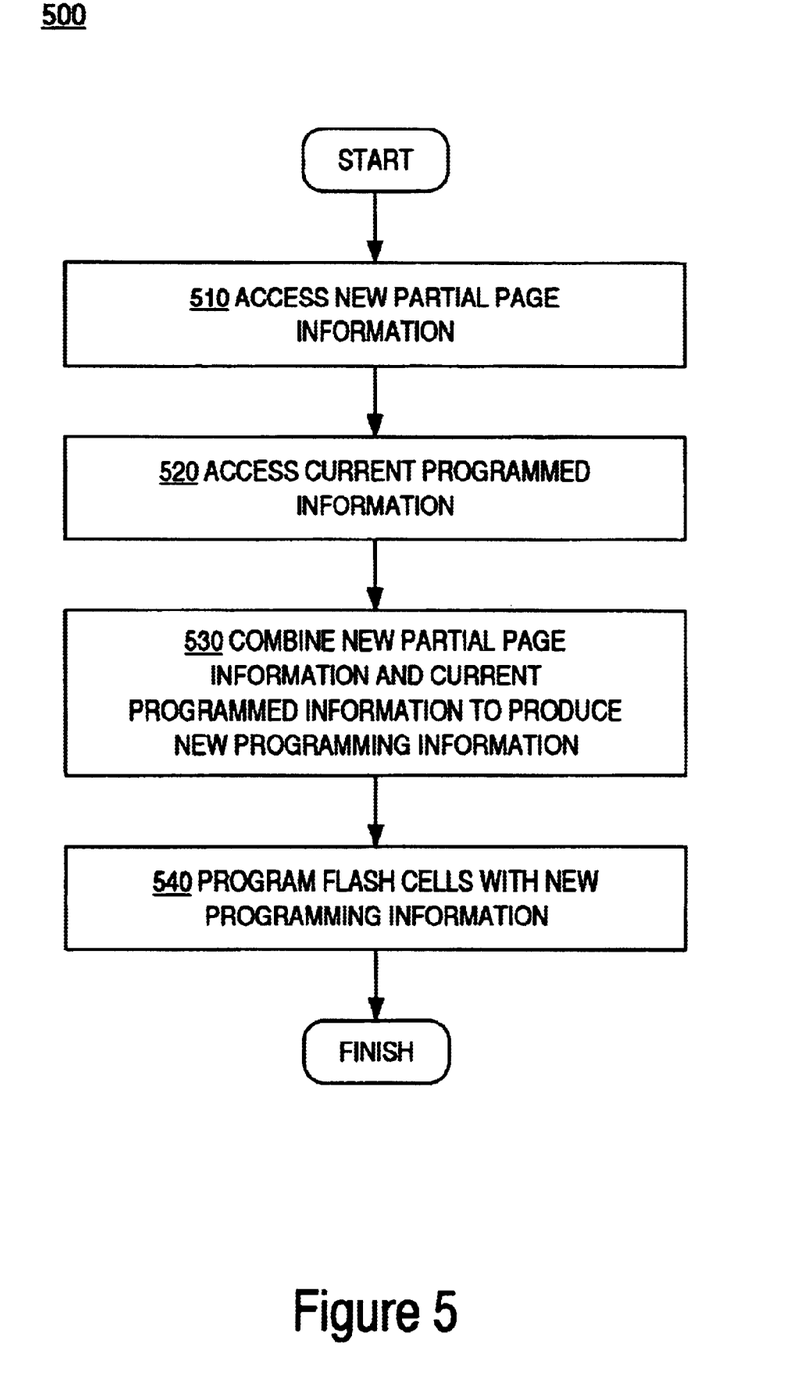
FIG. 5 illustrates a flow diagram for a method for programming a partial page in a multi level cell flash device, according to an embodiment of the present invention.

FIG. 5 illustrates a flow diagram for a method 500 for programming a partial page in a multi level cell flash device, according to an embodiment of the present invention.

In step 510, new partial page information may be accessed. Typically, the information would be presented at data pins on a flash device. It is appreciated that other well known methods of sending data, including as a serial bit stream, are well suited to embodiments of the present invention.

In step optional step 520, the current programmed state of a page of flash memory may be accessed. According to an embodiment of the present invention, this may be a read operation internal to the flash device, and the page contents may be read from a page of flash memory cells into a page buffer, which may be random access memory. It is appreciated that other well known methods of reading the contents of a page of memory, including an explicit read command from an external micro processor, are well suited to embodiments of the present invention.

In optional step 530, new partial page information may be combined with the current programmed state of a page of flash memory to produce new programming information.

In step 540, new programming information may be programmed into a page of flash memory cells. It is appreciated that well known flash programming methods, including verification steps, are well suited to embodiments of the present invention.

In this novel manner, a page multi level cell flash may be partially programmed without an intervening erase step.

Table 1 below describes the combination of new partial page programming information with existing programmed information produce new information for programming and verification in a multi level cell flash cell, according to an embodiment of the present invention.

TABLE 1

| New Data | Previously Stored Data | Combination to be programmed |
|---|---|---|
| 0 | 0 | 0 |
| 0 | 1 | 0 |
| 1 | 0 | 0 |
| 1 | 1 | 1 |

The left most column of Table 1 represents a possible data bit to be programmed. Such "new data" would typically be presented at the data bus of a flash device. The middle column of Table 1 represents a possible data bit that has been previously stored into a cell of flash memory, for example cell 100.

It is to be appreciated that for a multi level cell, such as cell 100, the bits in Table 1 do not represent the levels as described above, for example in association with FIG. 3, but rather represent individual bits. For example, data is typically read from and written to a flash memory as a parallel set of bits, usually eight or 16 bits wide. A column of Table 1 corresponds to but a single bit of that parallel set.

Table 1 describes the combination of new partial page programming information with existing programmed information produce new information for programming and verification in a multi level cell flash cell, according to an embodiment of the present invention. As has been discussed above (see discussion of FIG. 2 and FIG. 4), only certain partial page programming transitions may be allowed. Table 1 may describe those transitions.

The first row of Table 1 represents new data, for example bit 7 of a parallel set of bits, to be programmed as a portion of a partial page programming operation. In this case, bit 7 is 0, as shown in column 1 of row 1. The stored contents of a multi level cell that correspond to bit 7 is 0, as shown in column 2 of row 1. It is appreciated that these stored contents of the cell may represent either Q1 or Q2, as described in FIGS. 2 and 4A through 4C.

Column three of row 1 shows that the combination of the new data and the previously stored data should result in a value of 0 for this particular bit. This new value may be programmed and/or verified as either Q1 or Q2 which define a level of storage in a multi level cell, according to an embodiment of the present invention. It is appreciated that a convention, for example that bit 7 corresponds to Q1 of a particular cell, should be consistent in the use of Table 1.

This new data bit may be combined with another data bit that is determined in a similar manner, for example data bit 6 of the set of parallel bits, to form a multi bit field which corresponds to a storage level.

Referring once again to Table 1, it may be seen that all combinations of new partial page data bits and previously stored bits combine to form a 0 for the new program/verify bit value except for the last row, in which all bits are 1. That is, if the new partial program bit is 1, and the stored bit is 1, then the new program bit is also 1.

As an example, referring to FIG. 4B and to Table 1, let bit 6 of a set of parallel bits correspond to Q1 and bit 7 of a set of parallel bits correspond to Q2. Assume that the value 10 (Q2, Q1) has been previously stored into a multi level cell, for example cell 100. Further assume that it is desired to partial page program cell 100 to the value 00.

From row 2 of Table 1 it may be seen that for bit 7, Q2, a new partial page bit of 0 combined with a stored value of 1 should produce a new program/verify value of 0. Likewise, from row 1 of Table 1 it may be seen that for bit 7, Q1, a new partial page bit of 0 combined with a stored value of 0 should produce a new program/verify value of 0. Combining Q2 and Q1, this corresponds to transition 430 of FIG. 4B, from 10 to 00.

It is appreciated that Table 1 may be implemented as a logical AND circuit or other well known methods of producing such a correspondence (for example a lookup table) in accordance with embodiments of the present invention.

A preferred embodiment of Table 1 may be implemented with pre-charged page buffer registers within a semiconductor flash device. When pre-charged to "1," such a circuit may only be discharged during evaluation, or reading, and may not be reset to "1" until a subsequent read cycle.

Figure 6:
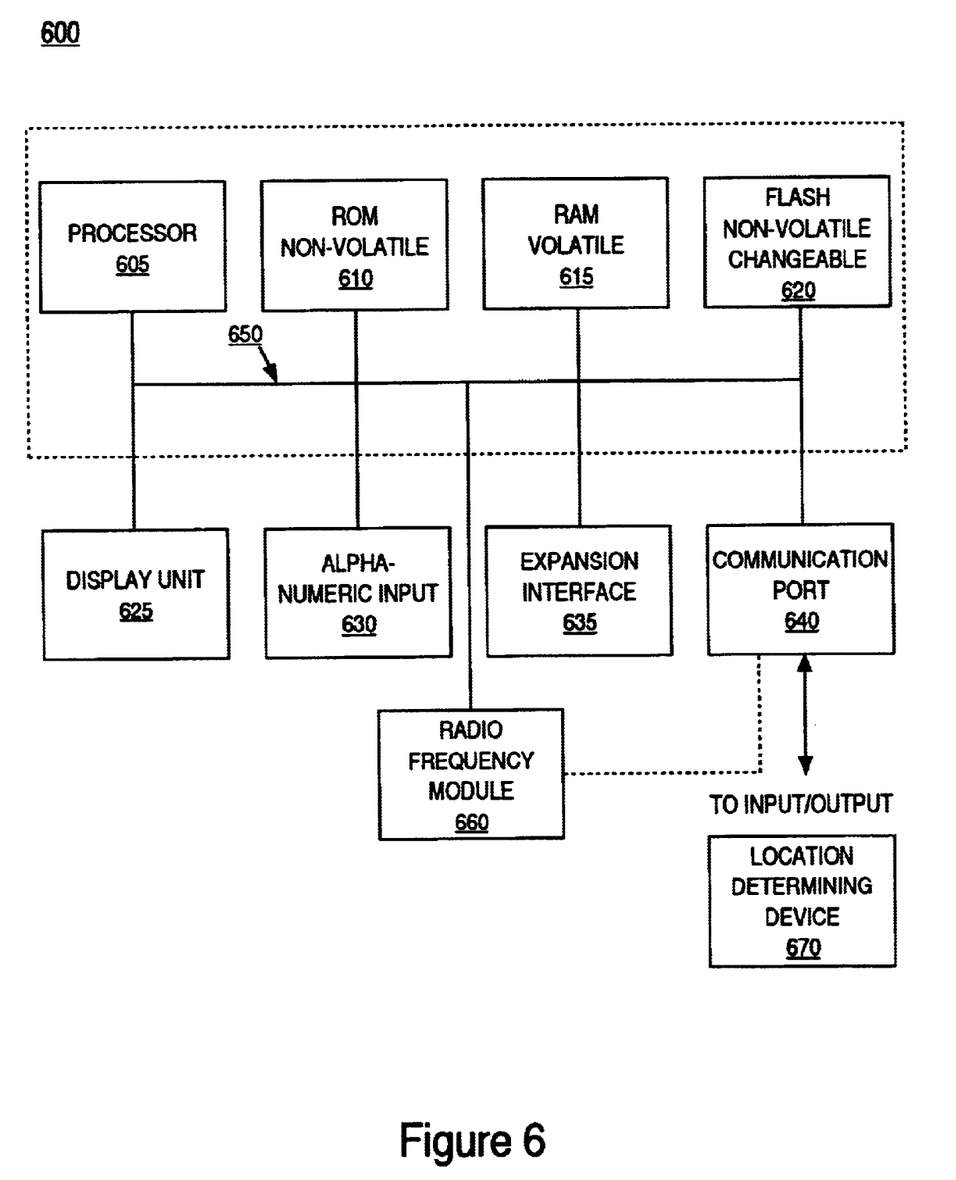
FIG. 6 is a block diagram of a computer system, which may be used as a platform to implement embodiments of the present invention.

FIG. 6 is a block diagram of a computer system 600, which may be used as a platform to implement embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and optionally a non-volatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605 which can be updated after the manufacture of system 600.

Pre-charged page buffer registers 624 may be included in the non-volatile memory 620 (e.g., flash). The RAM 615 may be used to provide a page buffer 622 for combining new and previous information that is to be programmed into the flash memory 620.

Also included in computer system 600 of FIG. 6 is an optional alphanumeric input device 630. Device 630 can communicate information and command selections to the central processor 600. Device 630 may take the form of a touch sensitive digitizer panel.

The optional display unit 625 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user.

Computer system 600 also optionally includes an expansion interface 635 coupled with the bus 650. Expansion interface 635 can implement many well known standard expansion interfaces, including without limitation the Secure Digital card interface, universal serial bus (USB) interface, Compact Flash, Personal Computer (PC) Card interface, CardBus, Peripheral Component Interconnect (PCI) interface, mini-PCI interface, IEEE 1394, Small Computer System Interface (SCSI), Personal Computer Memory Card International Association (PCMCIA) interface, Industry Standard Architecture (ISA) interface, or RS-232 interface. It is appreciated that external interface 635 may also implement other well known or proprietary interfaces, such as Memory Stick interface, commercially available from Sony Corporation.

In one embodiment of the present invention, expansion interface 635 may consist of signals substantially compliant with the signals of bus 650.

A wide variety of well known expansion devices may be attached to computer system 600 via expansion interface 635. Examples of such devices include without limitation rotating magnetic memory devices, flash memory devices, digital cameras, wireless communication modules, digital audio players and Global Positioning System (GPS) devices.

System 600 also optionally includes a communication port 640. Communication port 640 may be implemented as part of expansion interface 635. When implemented as a separate interface, communication port 640 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 1394 and synchronous ports.

System 600 optionally includes a radio frequency module 660, which may implement a mobile telephone, a pager, or a digital data link. Radio frequency module 660 may be interfaced directly to bus 650, via communication port 640 or via expansion interface 635.

The preferred embodiment of the present invention a system and method for partial page programming of a multi level flash is thus described. While the present invention has been described in particular embodiments, it should be appreciated that the present invention should not be construed as limited by such embodiments, but rather construed according to the below claims.

What is claimed is:

1. A semiconductor device comprising:
   a plurality of multi level flash memory cells, wherein said cells have one erased state and three programmed states; wherein said cells are programmable from a first programmed state directly to a second programmed state by writing two bits of information to the cell being programmed; and
   wherein programming from said first programmed state directly to said second programmed state comprises: a) reading existing cell storage condition from said cell; b) combining said existing cell storage condition with programming information to produce new information; and c) programming said new information into said cell, without an interposing erase operation.

2. The semiconductor device as described in claim 1 further comprising a page buffer, wherein said page buffer is for combining existing cell storage conditions with new partial page information.

3. The semiconductor device as described in claim 2 further comprising logic to combine said existing cell storage conditions with said new partial page information.

4. The semiconductor device as described in claim 3, wherein said logic is operable to produce allowable partial page program transitions.

5. A method of programming a partial page in a multi level flash device comprising:
   a) presenting new programing information to said device;
   b) reading existing cell storage conditions from said device;
   c) combining said existing cell storage conditions with programming information to produce new information; and
   d) programming said new information into said device, without an interposing erase operation.

6. The method as described in claim 5 wherein said reading is automatically performed internally to said device.

7. The method as described in claim 5 wherein said existing cell storage conditions are copied into a page buffer.

8. The method as described in claim 5 further wherein said combining is automatically performed internally to said device.

9. The method as described in claim 5 wherein said combining is performed in memory external to said device.

10. The method as described in claim 5 further wherein said combining takes place in a page buffer.

11. A semiconductor device comprising:

a plurality of flash memory cells, wherein said cells have one erased state and three programmed states; a page buffer coupled to said plurality of flash memory cells; wherein said cells are programmable from a first programmed state directly to a second programmed state by a method comprising: a) reading existing cell storage condition from said cell into said page buffer; b) combining, in said page buffer, existing said cell storage conditions with programming information to produce new information; and c) writing two bits of said new information to said cell being programmed, without and interposing erase operation.

12. The semiconductor device as described in claim 11 further comprising logic to combine said existing cell storage conditions with said new partial page information.

13. The semiconductor device as described in claim 12 wherein said logic is operable to produce allowable partial page program transitions.

14. A semi conductor device comprising:

a bus, a plurality of external ports for receiving programming information coupled to said bus;

a plurality of memory cells, for the non-volatile storing of two bits of information, wherein said memory cells have one erased state and three programmed states, and are coupled to said bus;

a page buffer, for combining new programming information with previously stored information to produce program verify information; and a state machine for placing new said programming information into said page buffer coupled to said bus;

said state machine also for placing previously stored information into said page buffer;

said state machine also for programming said program verify information into said memory cells by writing two bits of information to the cell being programmed.

15. A computer system comprising:

a processor coupled to a bus;

a first multi level cell flash memory coupled to said bus; and wherein said computer system contains instructions which when implemented perform a method of programming a partial page in said first multi level cell flash memory, said method comprising:
  a) presenting new programming information to said first multi level cell flash memory;
  b) reading existing cell storage conditions from said device;
  c) combining said existing cell storage conditions with programming information to produce new information; and
  d) programming said new information into said first multi level cell flash memory, without an interposing erase operation.

16. The method as described in claim 15 wherein said reading is automatically performed internally to said first multi level cell flash memory.

17. The method as described in claim 15 wherein said existing cell storage conditions are copied into a page buffer.

18. The method as described in claim 15 further wherein said combining is automatically performed internally to said first multi level cell flash memory.

19. The method as described in claim 17 wherein said computer system further comprises a second memory connected to said bus, and wherein said combining is performed in said second memory.

* * * * *